United States Patent
Arai et al.

(10) Patent No.: US 8,629,655 B2
(45) Date of Patent: *Jan. 14, 2014

(54) BATTERY CONTROL SYSTEM AND VEHICLE

(71) Applicants: Takuichi Arai, Toyota (JP); Tomitaro Hara, Okazaki (JP); Akira Tsujiko, Miyoshi (JP); Yohei Shindo, Nisshin (JP); Takeshi Abe, Okazaki (JP); Daisuke Teramoto, Toyota (JP); Keiko Wasada, Toyota (JP); Sachie Yuasa, Okazaki (JP)

(72) Inventors: Takuichi Arai, Toyota (JP); Tomitaro Hara, Okazaki (JP); Akira Tsujiko, Miyoshi (JP); Yohei Shindo, Nisshin (JP); Takeshi Abe, Okazaki (JP); Daisuke Teramoto, Toyota (JP); Keiko Wasada, Toyota (JP); Sachie Yuasa, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/722,759

(22) Filed: Dec. 20, 2012

(65) Prior Publication Data

US 2013/0113426 A1    May 9, 2013

Related U.S. Application Data

(62) Division of application No. 13/379,422, filed as application No. PCT/IB2010/001607 on Jun. 30, 2010, now Pat. No. 8,390,253.

(30) Foreign Application Priority Data

Jul. 1, 2009    (JP) ................ 2009-157195

(51) Int. Cl.
*H02J 7/00* (2006.01)

(52) U.S. Cl.
USPC ........... 320/109; 320/104; 320/116; 320/139; 307/149; 307/10.1; 180/65.1; 180/65.21

(58) Field of Classification Search
USPC ........................................... 320/109
See application file for complete search history.

(56) References Cited

U.S. PATENT DOCUMENTS

| 7,405,541 | B2 * | 7/2008 | Inokuchi et al. | 322/8 |
| 7,471,064 | B2 * | 12/2008 | Sobue et al. | 320/116 |
| 2003/0094321 | A1 * | 5/2003 | Hirata et al. | 180/65.2 |
| 2005/0194931 | A1 * | 9/2005 | Sobue et al. | 320/116 |
| 2005/0242775 | A1 * | 11/2005 | Miyazaki et al. | 320/116 |

(Continued)

FOREIGN PATENT DOCUMENTS

| EP | 1 615 043 A1 | 1/2006 |
| JP | 09-033620 | 2/1997 |

(Continued)

OTHER PUBLICATIONS

International Search Report in International Application No. PCT/IB2010/001607; Mailing Date: Nov. 2, 2010.

(Continued)

*Primary Examiner* — Yalkew Fantu
(74) *Attorney, Agent, or Firm* — Finnegan, Henderson, Farabow, Garrett & Dunner, LLP

(57) ABSTRACT

A battery control system controls an external charging unit in a vehicle including a vehicle body, engine, motors, secondary battery, and the external charging unit, and includes a degradation detecting unit that detects degradation of the secondary battery, during charging of the second battery by the external charging unit.

3 Claims, 16 Drawing Sheets

(56) References Cited

U.S. PATENT DOCUMENTS

| | | | |
|---|---|---|---|
| 2006/0132085 A1* | 6/2006 | Loubeyre | 320/104 |
| 2009/0099802 A1 | 4/2009 | Barsoukov et al. | |
| 2009/0184687 A1* | 7/2009 | Schroeder et al. | 320/162 |

FOREIGN PATENT DOCUMENTS

| | | |
|---|---|---|
| JP | 10-145981 | 5/1998 |
| JP | 2000-261901 | 9/2000 |
| JP | 2000-299137 | 10/2000 |
| JP | 2003-018756 | 1/2003 |
| JP | 2003-057321 | 2/2003 |
| JP | 2004-264076 | 9/2004 |
| JP | 2007-187533 | 7/2007 |
| JP | 2008-008703 | 1/2008 |
| JP | 2008-067523 | 3/2008 |
| JP | 2008-123961 | 5/2008 |
| JP | 2009-071986 | 4/2009 |

OTHER PUBLICATIONS

Written Opinion of the International Searching Authority in International Application No. PCT/IB2010/001607; Mailing Date: Nov. 2, 2010.

Applicant's Response to Written Opinion in International Application No. PCT/IB2010/001607 (Apr. 15, 2011).

Invitation to Submit Amendments in International Application No. PCT/IB2010/001607; Mailing Date: Apr. 29, 2011.

Applicant's Response to Invitation to Submit Amendments in International Application No. PCT/IB2010/001607 (May 18, 2011).

International Preliminary Report on Patentability in International Application No. PCT/IB2010/001607; Mailing Date: Oct. 10, 2011.

Notification of Reasons for Refusal in Japanese Patent Application No. 2009-157195; Drafting Date: Apr. 14, 2011.

* cited by examiner

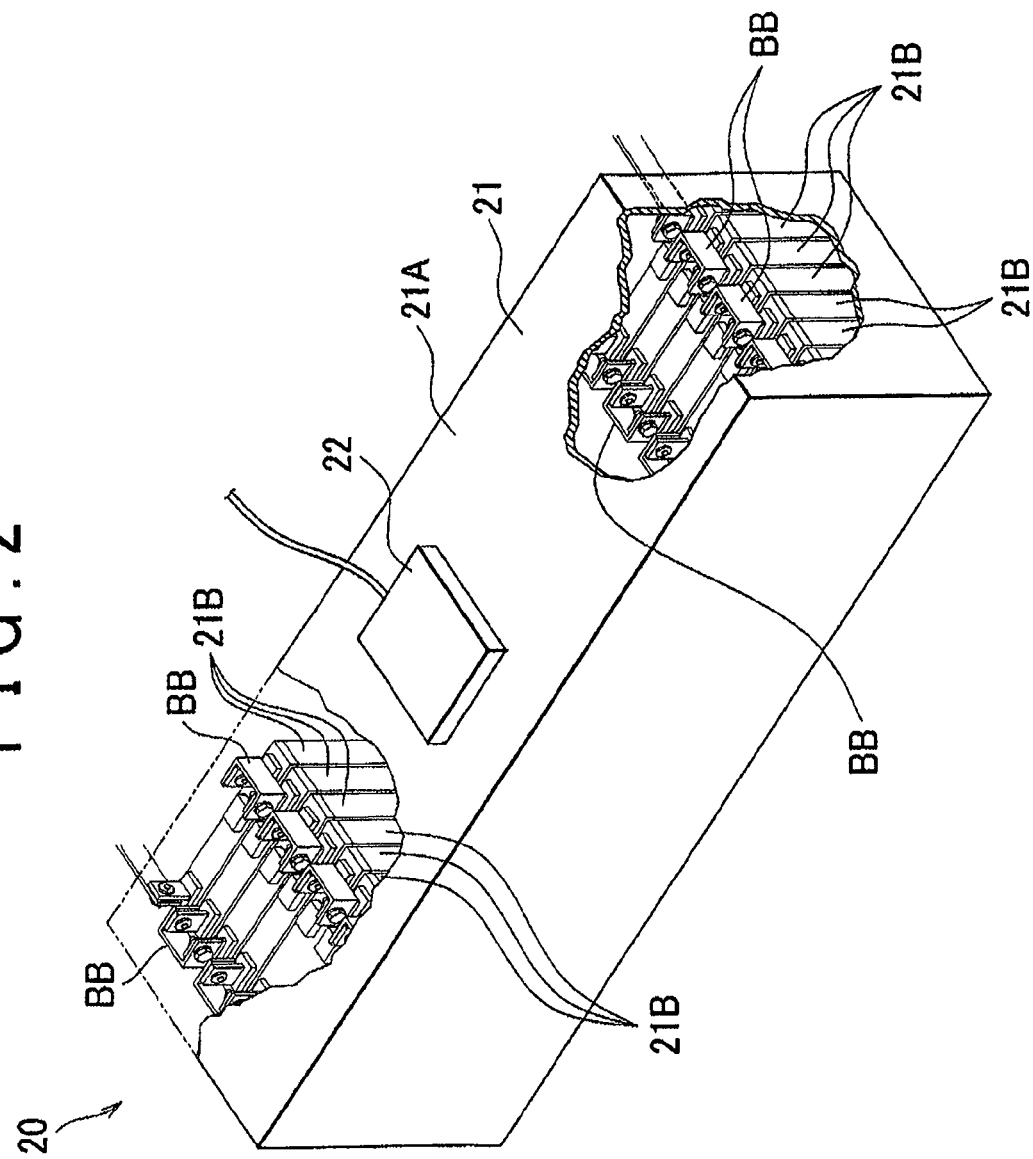

F I G . 8
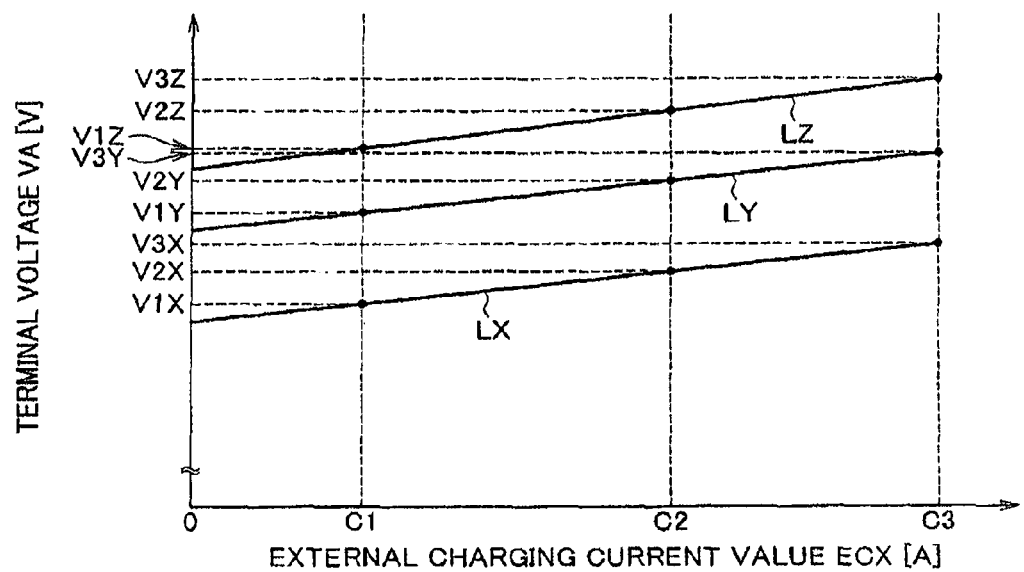

BATTERY CONTROL SYSTEM AND VEHICLE

CROSS-REFERENCE TO RELATED APPLICATIONS

This application is a division of U.S. application Ser. No. 13/379,422, which is a national phase of International Application No. PCT/IB2010/001607, filed Jun. 30, 2012, and claims the priority of Japanese Application No. 2009-157195, filed Jul. 1, 2009, the contents of all of which are incorporated herein by reference.

BACKGROUND OF THE INVENTION

1. Field of the Invention

The invention relates to a battery control system including an engine, a secondary battery used as a driving power source, and an external charging unit that charges the secondary battery using an external power supply, and also relates to a vehicle including the battery control system.

2. Description of the Related Art

In recent years, an externally chargeable electric vehicle, such as a so-called plug-in electric vehicle, on which a secondary battery that can be charged with an external power supply is installed as a driving power source, and a so-called hybrid electric vehicle on which an engine as well as the secondary battery is installed as a driving power source are in practical use. Japanese Patent Application Publication No. 2003-18756 describes calculating the internal resistance of a secondary battery installed on an electric vehicle when the secondary battery is put on charge.

In the meantime, it is necessary to control the engine and the secondary battery in the plug-in hybrid electric vehicle on which the secondary battery and the engine are installed as driving power sources, so as to stabilize the running performance of the vehicle, unlike the electric vehicle using only the secondary battery as the driving power source. It is, however, to be noted that the secondary battery degrades with use. Therefore, in the plug-in hybrid electric vehicle, the control for stabilizing the running performance of the vehicle cannot be appropriately performed on the secondary battery and the engine, unless the current condition of degradation of the secondary battery is grasped with high accuracy. As a result, a problem may arise in running of the vehicle, or the secondary battery may further degrade.

SUMMARY OF THE INVENTION

The invention provides a battery control system for a vehicle including an engine, a motor, a secondary battery, and an external charging unit that externally charges the secondary battery using an external power supply, which system controls the external charging unit so as to accurately detect degradation of the secondary battery. The invention also provides a vehicle including the battery control system.

A first aspect of the invention is concerned with a battery control system that controls an external charging unit, in a vehicle including a vehicle body, an engine and a motor installed on the vehicle body, a secondary battery used as a driving power source of the motor, and the external charging unit that externally charges the secondary battery, using an external power supply located outside the vehicle body. The battery control system includes a degradation detecting unit that detects degradation of the secondary battery during external charging of the second battery by the external charging unit.

The battery control system as described above includes the degradation detecting unit that detects degradation of the secondary battery during charging of the secondary battery by the external charging unit. Therefore, degradation of the secondary battery is detected, using stable charging current obtained by the external charging unit using the external power supply, rather than charging current with which the secondary battery is charged using the engine or the motor. Accordingly, the battery control system detects degradation of the secondary battery with high accuracy.

The external charging unit may be connected to a household receptacle or wall outlet located outside the vehicle body via a cable, and is operable to charge the secondary battery via an inverter.

Examples of the external power supply include a power supply that supplies power from a household receptacle (rated voltage: 100V) generally used at home, and a power supply that supplies power from an industrial receptacle (rated voltage: 100-300V) used in a factory, or the like. Another example of the external power supply is a charger (installation type fast charger, portable fast charger, etc.) that is located outside the vehicle and supplies electric energy obtained from the above-described receptacle to the vehicle. The degradation of the secondary battery may be in the form of, for example, increase of the battery resistance of the secondary battery, or reduction of the capacity of the secondary battery.

The battery control system according to the above aspect of the invention may further include an external charging current varying unit that sequentially varies a magnitude of external charging current with which the external charging unit externally charges the secondary battery, using the external power supply, among a plurality of external current values, and the degradation detecting unit may include a current variation type degradation detecting unit that detects degradation of the secondary battery, based on voltages respectively developed in the secondary battery when the secondary battery is externally charged at a first external current value, as one of the above-indicated plurality of external current values, and when the secondary battery is externally charged at a second external current value, as another of the plurality of external current values.

The battery control system as described above includes the external charging current varying unit as described above, and the degradation detecting unit includes the current variation type degradation detecting unit as described above. With this arrangement, the system is able to detect degradation of the secondary battery, using a plurality of external current values, and battery voltages corresponding to the respective current values. Accordingly, the system is able to detect degradation of the secondary battery with higher accuracy, as compared with the case where a certain external current value and a battery voltage corresponding to the external current value are used.

The external current value means the magnitude of external charging current that is passed through the secondary battery when degradation of the secondary battery is detected.

The battery control system according to the above aspect of the invention may further include an external charging interrupting unit that stops external charging of the secondary battery by the external charging unit using the external power supply, and places the secondary battery in a no-load condition over a predetermined interruption period after the external charging, and the degradation detecting unit may include a charge interruption type degradation detecting unit that detects degradation of the secondary battery, based on changes in the battery voltage of the secondary battery which occur during the predetermined interruption period.

The secondary battery has a characteristic that, if the secondary battery stops being charged and is brought into a no-load condition, the battery voltage momentarily drops largely (by a first voltage) immediately after the stop of charging, and then drops slowly or gently (by a second voltage). It is considered that the voltage drop by the degree of the first voltage does not depend on battery characteristics of the secondary battery, such as contact resistance of wires, but is caused by resistance to current passing through the battery. On the other hand, it is considered that the voltage drop by the degree of the second voltage is caused by material diffusion derived from electrochemical reactions in the secondary battery. Accordingly, it can be considered that the magnitude of the second voltage reflects how the electrochemical reactions occur in the secondary battery.

On the basis of the above finding, the battery control system as described above includes the external charging interrupting unit, and the degradation detecting unit includes the charge interruption type degradation detecting unit. With this arrangement, the above-mentioned first voltage and second voltage are detected from changes in the battery voltage when the secondary battery is held in a no-load condition over the predetermined interruption period. Then, the battery resistance arising from the electrochemical reactions within the secondary battery is obtained from the second voltage drop caused by the battery characteristics of the secondary battery, and the degree of degradation of the battery can be detected with high accuracy, based on the thus obtained battery resistance.

The above-mentioned interruption period is preferably 10 seconds or longer, and, more preferably, one minute or longer. The above-mentioned no-load condition means a condition in which neither charging current nor discharge current flows in the secondary battery.

The battery control system according to the above aspect of the invention may further include a state-of-charge detecting unit that detects a state of charge of the secondary battery, and a degradation detection executing unit that causes the degradation detecting unit to execute a process of detecting degradation of the secondary battery, when the state of charge of the secondary battery detected by the state-of-charge detecting unit becomes a specified state of charge while the external charging unit externally charges the secondary battery, using the external power supply.

The battery control system as described above includes the above-mentioned state-of-charge detecting unit and degradation detection executing unit. With this arrangement, the system detects the degree of degradation of the secondary battery when the battery is in a specified state of charge (for example, SOC=50%), so that changes in the degree of degradation with time can be grasped with high accuracy, and degradation of the secondary battery can be accurately detected.

In this connection, the state of charge (SOC) is an indicator that indicates how much of the discharge capacity is present in the secondary battery.

In the battery control system as described above, the degradation detection executing unit may cause the degradation detecting unit to execute a process of detecting degradation of the secondary battery, when the state of charge of the secondary battery becomes one of a plurality of specified states of charge.

As described above, if the secondary battery is in different states of charge (for, example, SOC 50% and SOC 90%), the indicator, such as battery resistance, indicative of the degree of degradation is likely to be different values. In view of this, the battery control system as described above detects degradation of the secondary battery when the battery is in a plurality of specified states of charge. Thus, the system can determine the degree of degradation with further improved accuracy, from the conditions of degradation in the plurality of specified states of charge.

In the battery control system as described above, the degradation detecting unit may detect degradation of the secondary battery, based on the magnitude of battery resistance of the secondary battery.

The battery resistance, which increases as the battery degrades, is an effective indicator or measure that indicates the degree of degradation. Therefore, the battery control system as described above detects degradation of the secondary battery based on the magnitude of battery resistance of the secondary battery. It is thus possible to detect the degree of deterioration of the battery with high accuracy, by comparing the magnitudes of battery resistance measured at different points in time.

The battery resistance may be, for example, the internal resistance of the secondary battery. Where the secondary battery is discharged with the same magnitude of current, for example, the apparent battery voltage of the secondary battery decreases as the magnitude of battery resistance of the secondary battery increases, resulting in a reduction of the output (the product of the magnitude of current and the battery voltage during discharge) of the secondary battery. Therefore, the increase or reduction of the magnitude of the battery resistance is one example of indicators indicative of the degree of degradation of the secondary battery.

A second aspect of the invention is concerned with a vehicle including a vehicle body, an engine and a motor installed on the vehicle body, a secondary battery used as a driving power source of the motor, an external charging unit that externally charges the secondary battery, using an external power supply located outside the vehicle body, and the battery control system according to the first aspect of the invention.

The vehicle includes the above-described battery control system, and is therefore able to detect degradation of the secondary battery, using more stable current (charging current) of the external power supply than that provided by the engine or motor. Accordingly, the vehicle is able to detect degradation of the secondary battery used as a driving power source of the motor.

BRIEF DESCRIPTION OP THE DRAWINGS

The features, advantages, and technical and industrial significance of this invention will be described in the following detailed description of example embodiments of the invention with reference to the accompanying drawings, in which like numerals denote like elements, and wherein;

FIG. 2 is an explanatory view of a battery assembly installed on the vehicle according to the first and second embodiments;

FIG. 8 is a graph indicating the relationship between the terminal voltage of secondary batteries of the first embodiment and the external charging current value;

DETAILED DESCRIPTION OF EMBODIMENTS

Figure 1:
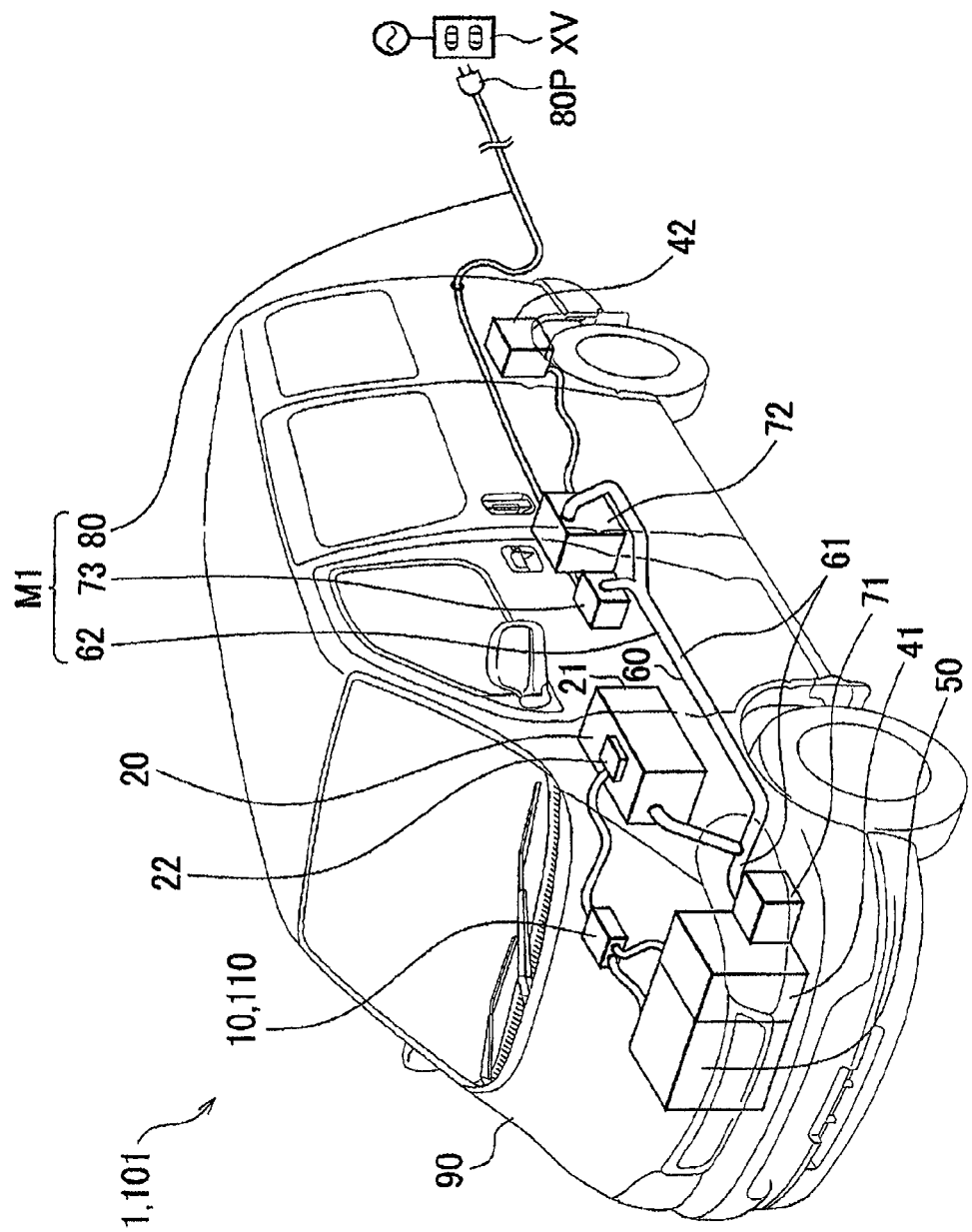
FIG. 1 is a perspective view of a vehicle according to first and second embodiments of the invention.

A first embodiment of the invention will be described with reference to the drawings. Initially, a vehicle 1 according to the first embodiment will be described. FIG. 1 is a perspective view of the vehicle 1. The vehicle 1 is a plug-in hybrid electric vehicle including a vehicle body 90, an engine 50, a front motor 41, a rear motor 42, a plurality of lithium-ion secondary batteries (which may also be simply called "batteries") that constitute a battery assembly 20, and a control device 10. The vehicle 1 further includes first cable 61 and second cable 62 that are tied together into a cable 60, a first inverter 71, a second inverter 72, a converter 73, and a plug cable 80 having a plug 80P mounted at the distal end thereof. In the vehicle 1, the plug cable 80, converter 73 and the second cable 62 constitute an external charging unit M1.

While the vehicle 1 is in operation (i.e., the ignition key is in the ON position), the vehicle 1 is able to run like an electric vehicle, using the front motor 41 and the rear motor 42, and is also able to run as a hybrid electric vehicle, using the front motor 41 and rear motor 42, and the engine 50. After the operation of the vehicle 1 is finished (i.e., when the ignition key is in the OFF position), the plurality of batteries 21B in the battery assembly 20 can be charged, using an external power supply XV installed outside the vehicle 1, in substantially the same manner as in an electric vehicle. The external power supply XV of this embodiment supplies power from a household receptacle or wall outlet (rated voltage: 100V) generally used at home. When the external power supply XV is used, the plug 80P (see FIG. 1) located at the distal end of the plug cable 80 is directly inserted into the household receptacle.

The first cable 61 of the vehicle 1 electrically connects the first inverter 71 with the battery assembly 20, and electrically connects the second inverter 72 with the battery assembly 20. The second cable 62 electrically connects the converter 73 with the battery assembly 20. The first cable 61 and the second cable 62 are tied together into a bundle, and then covered with insulating resin, to provide a branched cable 60 (see FIG. 1).

As shown in FIG. 2, the battery assembly 20 of the vehicle 1 has a battery portion 21 including a plurality of batteries 21B disposed in a battery case 21A, and a battery monitoring device 22. The battery monitoring device 22 obtains a value of terminal voltage VA across terminals of each of the batteries 21B, using sensing lines (not shown). Also, the battery monitoring device 22 obtains the magnitude of current (external charging current EC and external discharge current ED, which will be described later) that passes through the battery assembly 20, using a current sensor (not shown). In the battery portion 21, one hundred batteries 21B each including wound-type power generating elements (not shown) are housed in a rectangular, box-shaped battery case. These batteries 21B are fastened with bolts and bus bars 13B, and thus connected in series with each other.

The control device 10 of the vehicle 1 includes a microcomputer that has CPU, ROM and RAM (not shown), and is configured to run certain programs. The control device 10 communicates with the front motor 41, rear motor 42, engine 50, first inverter 71, second inverter 72, converter 73, and the battery monitoring device 22, which are installed within the vehicle 1. In the control device 10, numerical values of battery resistances (first-state initial resistance RAX0, second-state initial resistance RAY0, and third-state initial resistance RAZ0) in the initial period of installation of the batteries on the vehicle, out of battery resistances (first-state resistance RAX, second-state resistance RAY, and third-state resistance RAZ) of the batteries 21B which will be described later, are stored in advance.

The control device 10 controls the above-described external charging unit M1. Namely, the control device 10 controls the converter 73 of the external charging unit M1, so as to charge the battery assembly 20 (batteries 21B), using the external power supply XV.

Figure 3A:
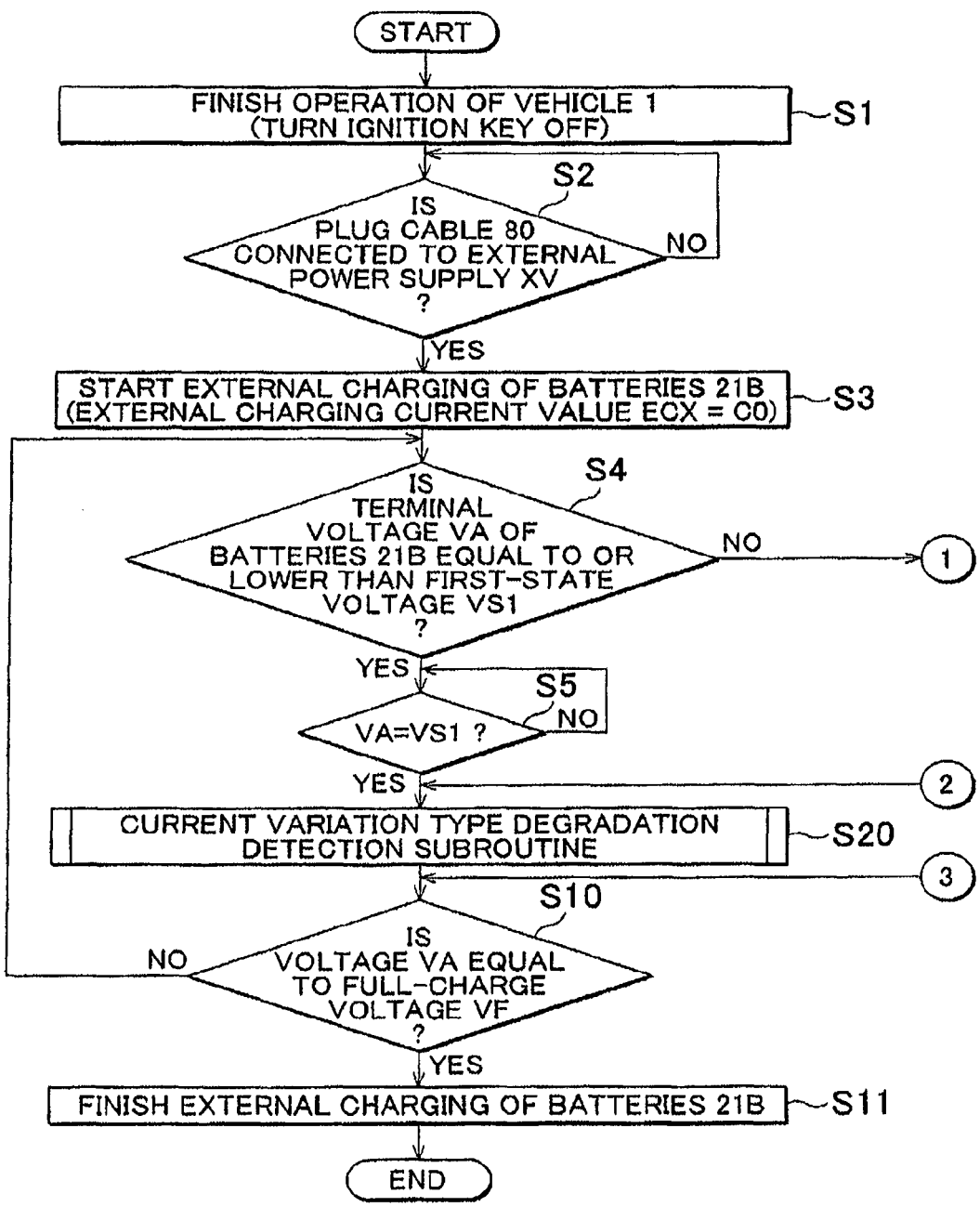
FIGS. 3A and 3B are a flowchart illustrating a main routine of the first embodiment.
Figure 3B:
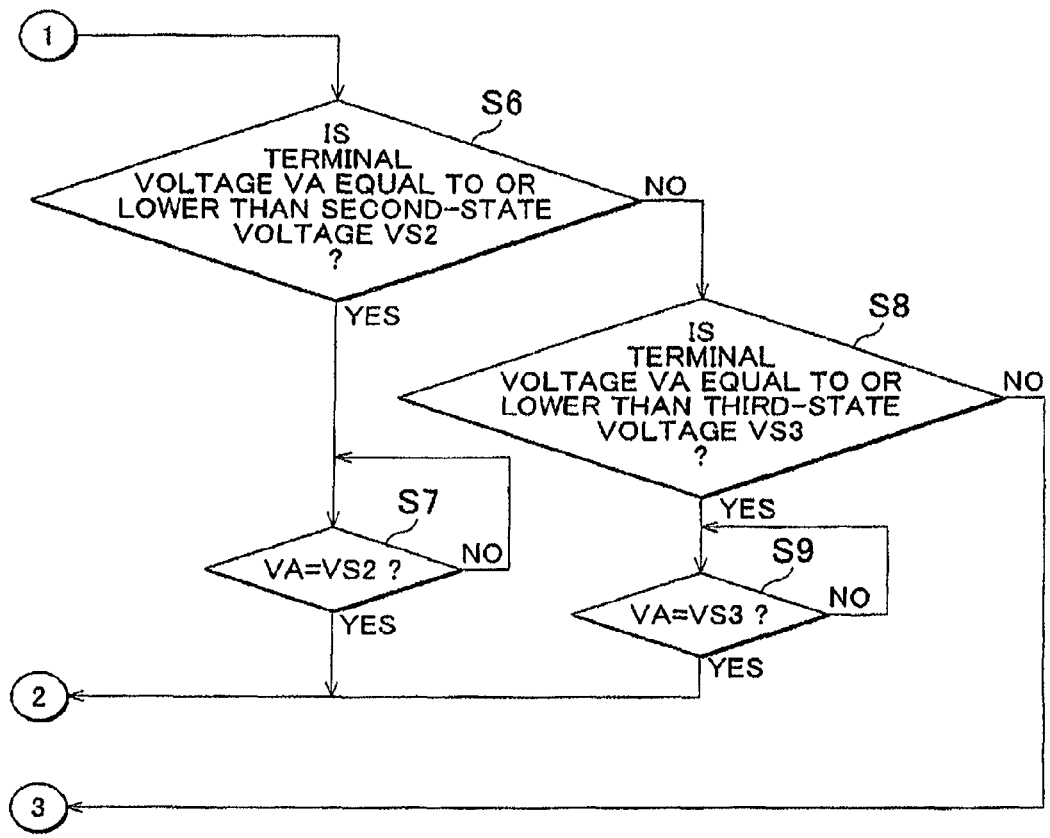

During charging of the batteries 21B with the external charging unit M1, the control device 10 detects degradation of the batteries 21B, based on the rate of change RM of battery resistance (which will be described later) of the batteries 21B, according to a main routine as illustrated in FIGS. 3A and 3B. The main routine will be described in detail with reference to the flowcharts of FIG. 3A through FIG. 7.

Initially, the operation of the vehicle 1 is finished (i.e., the ignition key is turned off) (step S1), and it is determined in step S2 whether the plug cable 80 of the external charging unit M1 is connected to the external power supply XV. Mote specifically, the control device 10 detects whether a voltage (e.g., AC 100V) of the external power supply XV is applied to the converter 73 via the plug cable 80. If the plug cable 80 is not connected to the external power supply XV, step S2 is repeatedly executed. If the plug cable 80 is connected to the external power supply XV, the control device 10 proceeds to step S3.

In step S3, the control device 10 causes the external charging unit M1 to start external charging of the batteries 21B. In this step, the control device 10 controls the converter 73 so that the magnitude of external charging current EC (external charging current value ECX) with which the batteries 21B are externally charged becomes equal to a predetermined basic current value C0.

In step S4, it is determined whether the state of charge (SOC) SC of the batteries 21B is equal to a predetermined value. More specifically, it is determined whether the terminal voltage VA of the batteries 21B is equal to or lower than a first-state voltage VS1 corresponding to a first state of charge SC1 (corresponding to SOC 50% in this embodiment). If the terminal voltage VA is higher than the first-state voltage VS1, the control device 10 proceeds to step S6. On the other hand, if the terminal voltage VA is equal to or lower than the first-state voltage VS1, the control device 10 proceeds to step S5. In step S5, it is determined whether the terminal voltage VA is equal to the first-state voltage VS1. If the terminal voltage VA is lower than the first-state voltage VS1, step S5 is repeatedly executed. As a result, charging of the batteries 21B proceeds. On the other hand, if the terminal voltage VA is equal to the first-state voltage VS1, the control device 10 proceeds to a current variation type degradation detection subroutine of step S20 which will be described later, in which the external charging current value is varied or changed to a plurality of charging current values C1, C2, C3, so as to externally charge the batteries 21B.

In step S6, it is determined whether the terminal voltage VA of the batteries 21B that are charged at the basic current value C0 is equal to or lower than a second-state voltage VS2 corresponding to a second state of charge SC2 (corresponding to SOC 70% in this embodiment). If the terminal voltage VA is higher than the second-state voltage VS2, the control device 10 proceeds to step S8. On the other hand, if the terminal voltage VA is equal to or lower than the second-state voltage VS2, the control device 10 proceeds to step S7 In step S7, it is determined whether the terminal voltage VA is equal to the second-state voltage VS2. If the terminal voltage VA is lower than the second-state voltage VS2, step S7 is repeatedly executed. As a result, charging of the batteries 21B proceeds. On the other hand, if the terminal voltage VA is equal to the second-state voltage VS2, the control device 10 proceeds to the current variation type degradation detection subroutine of step S20.

In step S8, it is determined whether the terminal voltage VA of the batteries 21B that are charged at the basic current value C0 is equal to or lower than a third-state voltage VS3 corresponding to a third state of charge SC3 (corresponding to SOC 90% in this embodiment). If the terminal voltage VA is higher than the third-state voltage VS3, the control device 10 proceeds to step S10. On the other hand, if the terminal voltage VA is equal to or lower than the third-state voltage VS3, the control device 10 proceeds to step S9. In step S9, it is determined whether the terminal voltage VA is equal to the third-state voltage VS3. If the terminal voltage VA is lower than the third-state voltage VS3, step S9 is repeatedly executed. As a result, charging of the batteries 21B proceeds. On the other hand, if the terminal voltage VA is equal to the third-state voltage VS3, the control device 10 proceeds to the current variation type degradation detection subroutine of step S20.

Figure 4:
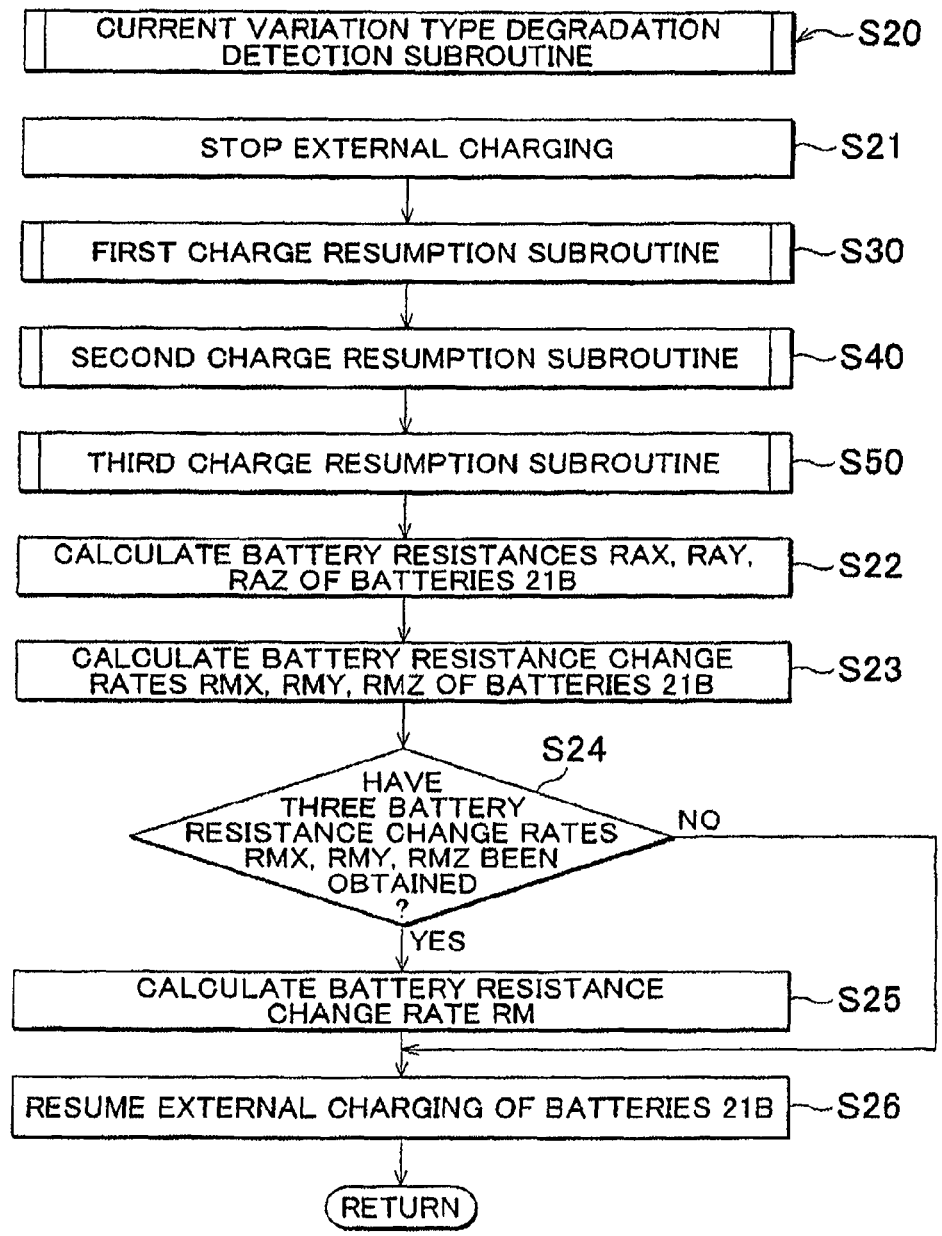
FIG. 4 is a flowchart illustrating a current variation type degradation detection subroutine of the first embodiment.

Next, the current variation type degradation detection subroutine of step S20 will be described with reference to FIG. 4. The current variation type degradation detection subroutine S20 includes a first charge resumption subroutine S30, a second charge resumption subroutine S40, and a third charge resumption subroutine S50. In the first charge resumption subroutine S30, the external charging current value ECX of the batteries 21B is changed to a specified charging current value C1, and external charging is resumed for a short period of time. In the second charge resumption subroutine S40, the external charging current value ECX of the batteries 21B is changed to a specified charging current value C2, and external charging is resumed for a short period of time. In the third charge resumption subroutine S50, the external charging current value ECX is changed to a specified charging current value C3, and external charging is resumed for a short period of time. Then, the battery resistances (first-state resistance RAX, second-state resistance RAY, and third-state resistance RAZ) of the batteries 21B are calculated, based on measurement values obtained in the first charge resumption subroutine S30, the second charge resumption subroutine S40, and the third charge resumption subroutine S50, respectively. The current variation type degradation detection subroutine S20 is performed an the batteries 21B with respect to which the condition of step S5, step S7 or step S9 of the main routine is satisfied. Namely, the state of charge SC of the batteries 21B may be the first state of charge SC1, or the second state of charge SC2, or the third state of charge SC3. First, the case where the state of charge SC of the batteries 21B is the first state of charge SC1 will be explained below.

Initially, in step S21, external charging of the batteries 21B at the basic current value C0 is stopped for five minutes. As a result, the terminal voltage VA of the batteries 21B is once stabilized from a voltage under load to a no-load voltage (open-circuit voltage).

Figure 5:
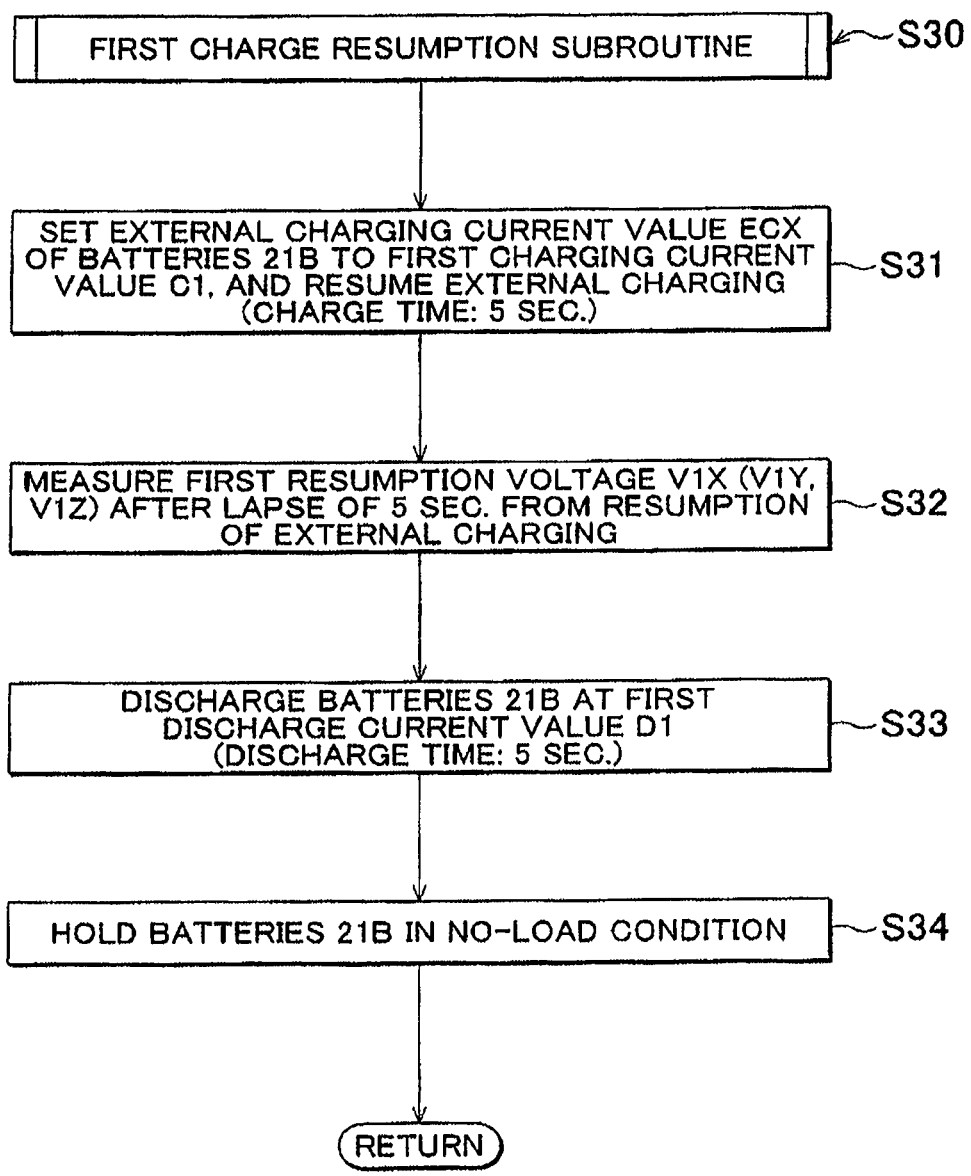
FIG. 5 is a flowchart illustrating a first charge resumption subroutine of the first embodiment.

Then, the control device 10 proceeds to the first charge resumption subroutine of step S30. In the first charge resumption subroutine S30, as shown in FIG. 5, the external charging current value ECX of the batteries 2111 is set to a first charging current value C1 (0.5 A in this embodiment), and external charging is resumed for a short period of time (five seconds) (step S31). Then, the battery monitoring device 22 measures the terminal voltage (first resumption voltage V1X) of the batteries 21B after a lapse of five seconds from the resumption of external charging (step S32).

Then, in step S33, the magnitude of external discharge current ED of the batteries 21B (external discharge current value EDX) is set to a first discharge current value D1 (D1=C1) that is equal to the first charging current value C1 of step S31, and the batteries 21B are discharged. The duration of discharging (discharge time) is set to five seconds, so that the amount of electricity with which the batteries 21B was externally charged in the above step S31 is discharged. Thus, the state of charge SC of the batteries 21B after discharging becomes equal to that established immediately before step S22. After execution of step S33, the batteries 21B are held in a no-load condition over a given period of time (step S34), and the control device 10 returns to the current variation type degradation detection subroutine S20.

Figure 6:
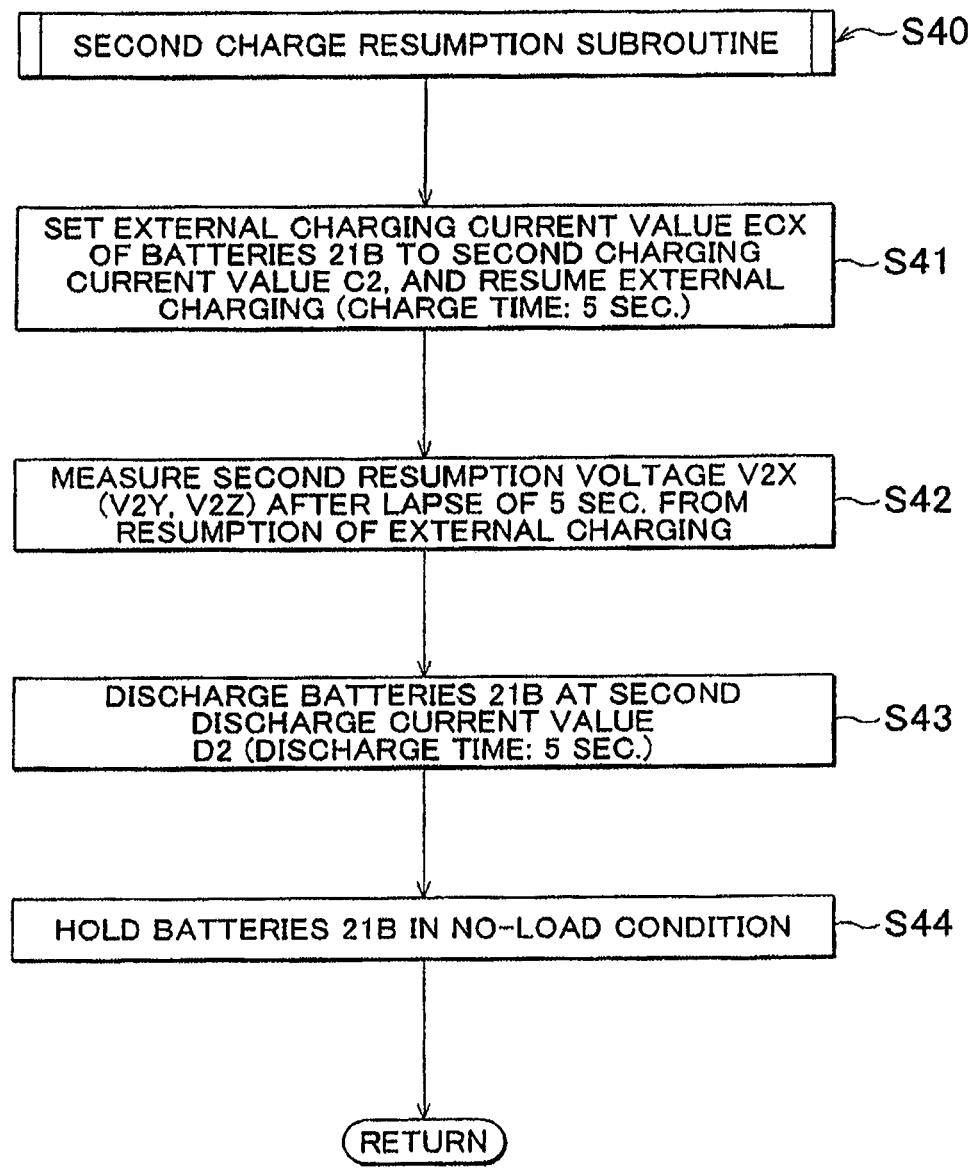
FIG. 6 is a flowchart illustrating a second charge resumption subroutine of the first embodiment.

Subsequently, the control device 10 proceeds to the second charge resumption subroutine of step S40. In the second charge resumption subroutine S40, as shown in FIG. 6, the external charging current value ECX of the batteries 21B is set to a second charging current value C2 (1.0 A in this embodiment), and external charging is resumed for a short period of time (five seconds) (step S41). Then, the battery monitoring device 22 measures the terminal voltage (second resumption voltage V2X) of the batteries 21B after a lapse of five seconds from the resumption of external charging (step S42).

Then, in step S43, the external discharge current value EDX is set to a second discharge current value D2 (D2=C2) that is equal to the second charging current value C2 of step S41, and the batteries 21B are discharged (the discharge time is five seconds). After execution of step S43, the batteries 21B are held in a no-load condition over a given period of time (step S44), and the control device 10 returns to the current variation type degradation detection subroutine S20.

Figure 7:
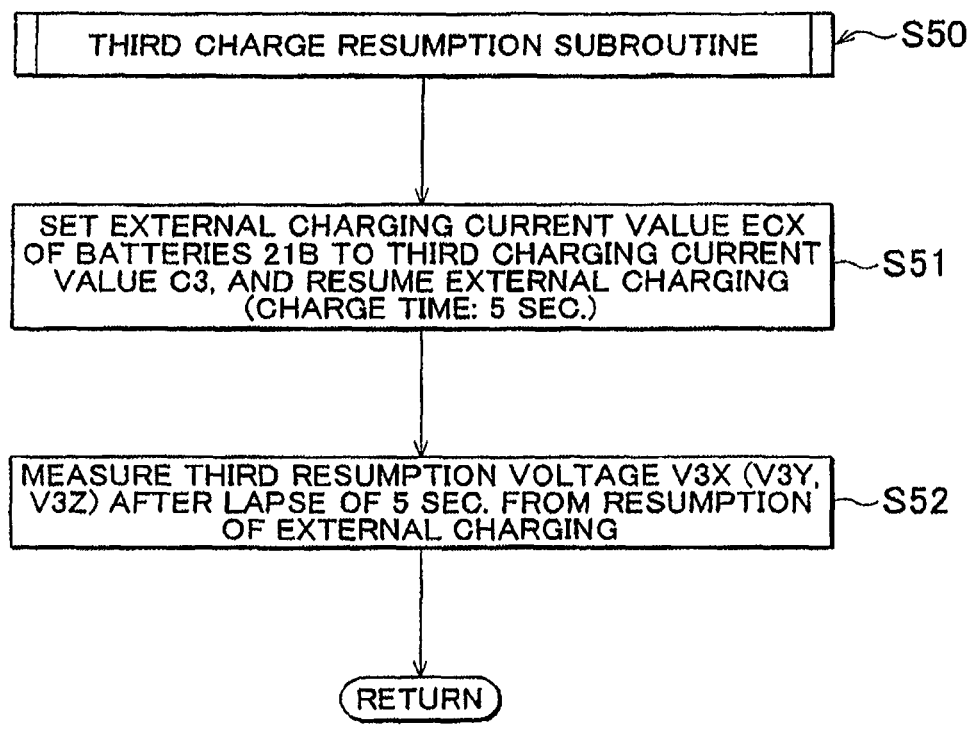
FIG. 7 is a flowchart illustrating a third charge resumption subroutine of the first embodiment.
Figure 9A:
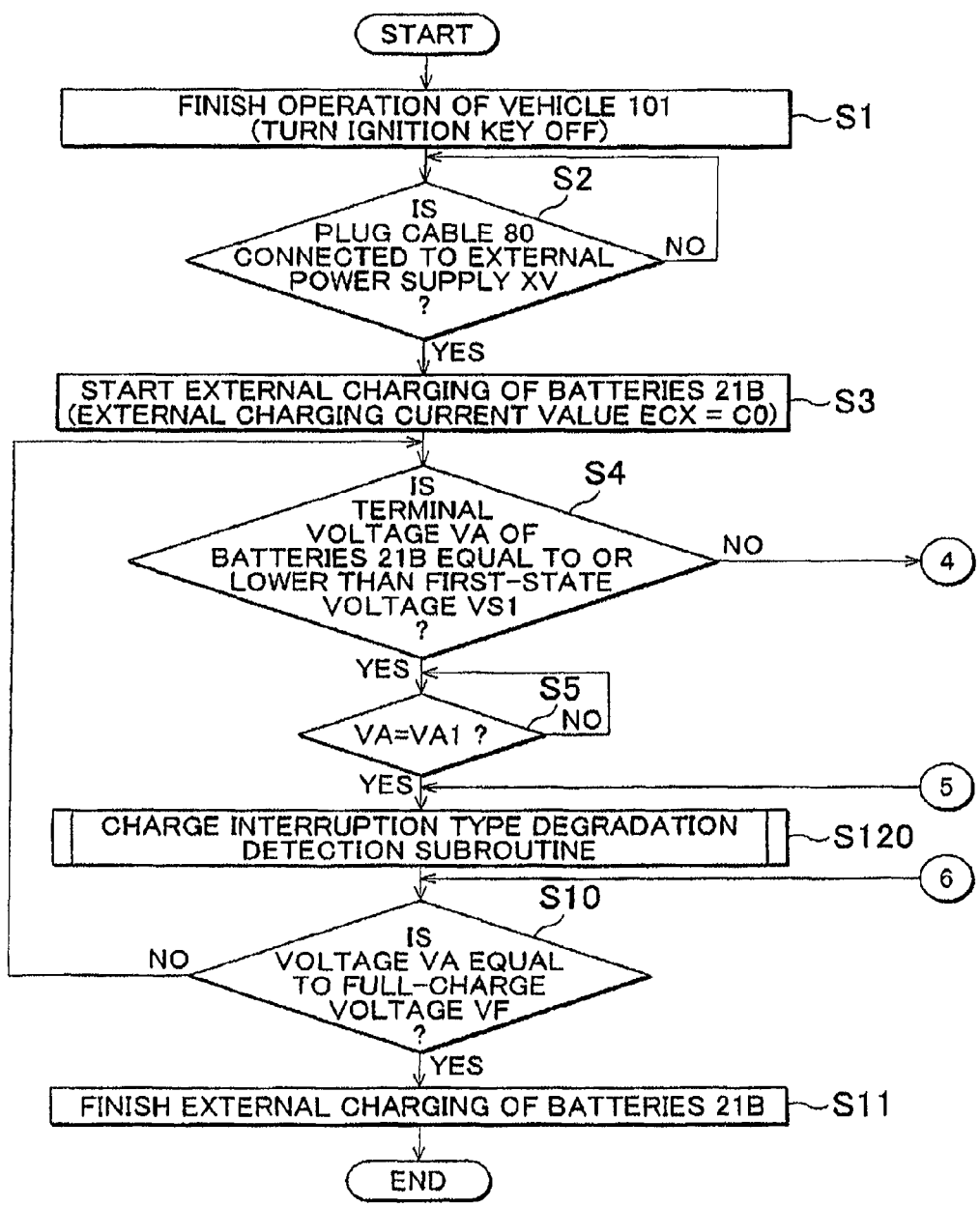
FIGS. 9A and 9B are a flowchart illustrating a main routine of the second embodiment.
Figure 9B:
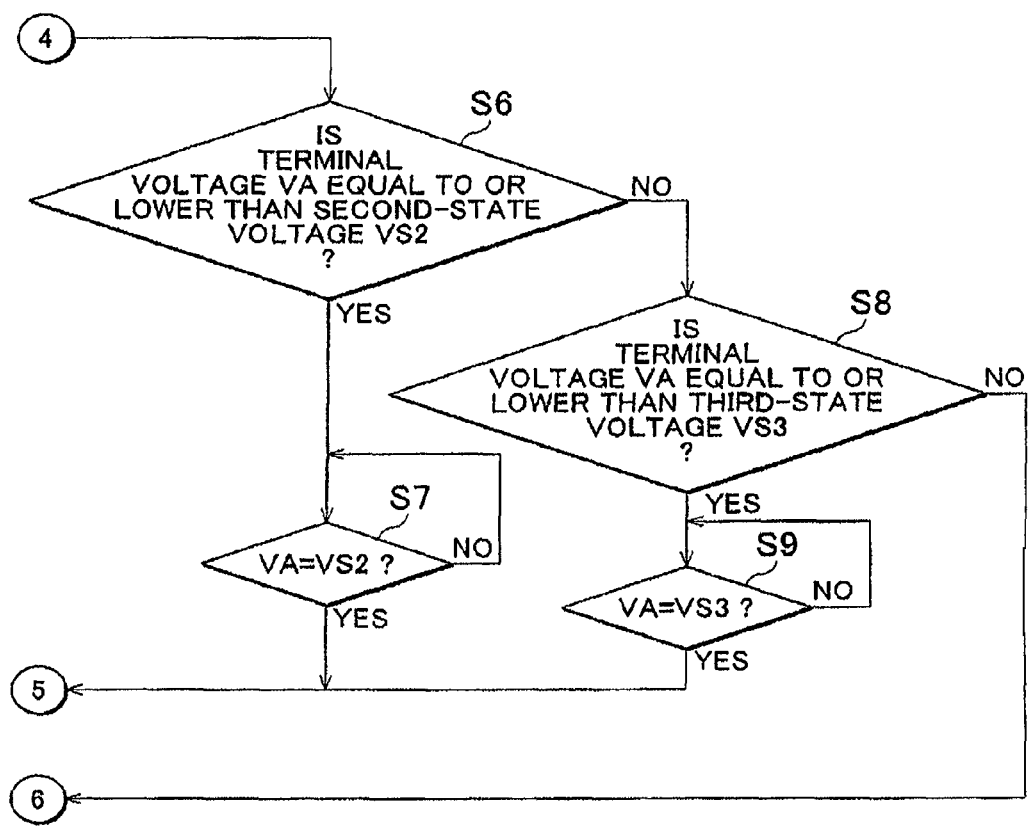

Subsequently, the control device 10 proceeds to the third charge resumption subroutine of step S50. In the third charge resumption subroutine S50, as shown in FIG. 7, the external charging current value ECX of the batteries 21B is set to a third charging current value C3 (2.0 A in this embodiment), and external charging is resumed for a short period of time (five seconds) (step S51). Then, the battery monitoring device 22 measures the terminal voltage (third resumption voltage V3X) of the batteries 21B after a lapse of five seconds from the resumption of external charging (step S52). Then, the control device 10 returns to the voltage variation type degradation detection subroutine S20.

Then, in step S22, the control device 10 calculates a first-state resistance RAX for the case where the state of charge SC is the first state of charge SC1 (SOC 50%), as one of the battery resistances of the batteries 21B, based on the first charging current value C1, second charging current value C2 and third charging current value C3, and the first resumption voltage V1X, second resumption voltage V2X and third resumption voltage V3X measured by the battery monitoring device 22. More specifically, a measurement condition and a measurement result (the first charging current value C1, the first resumption voltage V1X) of the first charge resumption subroutine S30, a measurement condition and a measurement result (the second charging current value C2, the second resumption voltage V2X) of the second charge resumption subroutine S40, and a measurement condition and a measurement result (the third charging current value C3, the third resumption voltage V3X) of the third charge resumption subroutine S50 are plotted on a graph (see FIG. 8) in which the vertical axis indicates the terminal voltage 15. VA of the batteries 21B, and the horizontal axis indicates the external charging current value ECX. Then, a regression line (first regression line LX) passing these points on the graph is drawn, and the slope of the first regression line LX is determined as the first-state resistance RAX of the batteries 21B.

In the cases where the state of charge SC of the batteries 21B is the second state of charge SC2 (SOC 70%) and where the state of charge SC is the third state of charge SC3 (SOC 90%), too, a second-state resistance RAY of the batteries 21B in the second state of charge SC2 and a third-state resistance RAZ in the third state of charge SC3 are calculated in the same manner as in the above-described step S22. More specifically, a measurement condition and a measurement result (first charging current value C1, first resumption voltage V1Y) of the first charge resumption subroutine S30, a measurement condition and a measurement result (second charging current value C2, second resumption voltage V2Y) of the second charge resumption subroutine S40, and a measurement condition and a measurement result (third charging current value C3, third resumption voltage V3Y) of the third charge resumption subroutine S50, in the case where the state of charge SC is the second state of charge SC2, are plotted on the graph as shown in FIG. 8. Then, a regression line (second regression line LY) passing these points on the graph is drawn, and the slope of the second regression line LY is determined as the second-state resistance RAY of the batteries 21B. In the case where the state of charge SC is the third state of charge SC3, too, a measurement condition and a measurement result (first charging current value C1, first resumption voltage V1Z) of the first charge resumption subroutine S30, a measurement condition and a measurement result (second charging current value C2, second resumption voltage V2Z) of the second charge resumption subroutine S40, and a measurement condition and a measurement result (third charging current value C3, third resumption voltage V3Z) of the third charge resumption subroutine S50 are plotted on the graph as shown in FIG. 8, as in the case where the state of charge SC is the second state of charge SC2. Then, a regression line (third regression line LZ) passing these points on the graph is drawn, and the slope of the third regression line LZ is determined as the third-state resistance RAZ of the batteries 21B.

Then, in step S23, the rate of change RMX of the first-state resistance of the batteries 21B is calculated. The first-state resistance change rate RMX is a value obtained by dividing the value of the first-state resistance RAX by the first-state initial resistance RAX0 of the batteries 21B. In the case where the state of charge SC of the batteries 21B is the second state of charge SC2 and the case where the state of charge SC is the third state of charge SC3, too, the second-state resistance change rate RMY and the third-state resistance change rate RMZ are calculated, respectively, in the same manner as described above.

Then, in step S24, it is determined whether three rates of change of battery resistance (first-state resistance change rate RMX, second-state resistance change rate RMY, and third-state resistance change rate RMZ) have been obtained with respect to the first state of charge SC1, second state of charge SC2, and the third state of charge SC3, respectively. If any of the first-state resistance change rate RMX, second-state resistance change rate RMY and the third-state resistance change rate RMZ has not been obtained, the control device 10 skips step S25, and proceeds to step S26. On the other hand, if all of the first-state resistance change rate RMX, second-state resistance change rate RMY and the third-state resistance change rate RMZ are obtained, the control device 10 proceeds to step S25, and calculates the rate of change RM of battery resistance of the batteries 21B.

In step S25, the battery resistance change rate RM is calculated by averaging the first-state resistance change rate RMX, second-state resistance change rate RMY and the third-state resistance change rate RMZ. The battery resistance change rate RM, and the first-state resistance change rate RMX, second-state resistance change rate RMY and the third-state resistance change rate RMZ provide indicators that indicate the degree of degradation of the batteries 21B.

In step S26, external charging of the batteries 21B at the basic current value C0 is resumed, and the control device 10 completes the current variation type degradation detection subroutine S20 and returns to the main routine. In step S10, it is determined whether the terminal voltage VA of the batteries 21B that are charged at the basic current value C0 is equal to a full-charge voltage VF corresponding to the full state of charge (SOC 100%). If the terminal voltage VA is lower than the full-charge voltage VF, the control device 10 returns to step S4. If the terminal voltage VA is equal to the full-charge voltage VF, the control device 10 proceeds to step S11, and finishes external charging of the batteries 210.

The magnitude of charging current that passes through the batteries 210 due to the operation of the engine 50 or the front motor 41 and rear motor 42 varies by great degrees, and may not be kept constant even for one second, for example. Accordingly, it is difficult to measure the battery resistance of the batteries 21B in a stable condition, by using the engine 50 or the front motor 41 and rear motor 42 for charging the batteries 21B for a specified period of time (e.g., five seconds) with the magnitude of charging current being controlled to a predetermined value (e.g., the above-indicated first charging current value C1).

On the other hand, the control device 10 of the vehicle 1 according to this embodiment is configured to execute the current variation type degradation detection subroutine S20 for detecting the rate of change RM of battery resistance indicative of the degree of degradation of the batteries 21B, during charging of the batteries 21B with the external charging unit M1. It is therefore possible to detect the battery resistances RAX, RAY, RAZ of the batteries 21B, and determine the battery resistance change rate RM indicative of the degree of degradation, from the above battery resistances, by using a stable external charging current EC obtained by the external charging unit M1 using the external power supply XV, rather than charging current for charging the batteries 21B using the engine 50 or the front motor 41 and rear motor 42. Accordingly, the control device 10 is able to detect degradation of the batteries 21B with high accuracy.

Also, the current variation type degradation detection subroutine S20 executed by the control device 10 includes the first charge resumption subroutine S30, second charge resumption subroutine S40 and the third charge resumption subroutine S50. Thus, when the current state of charge SC is the first state of charge SC1 (i.e., when the batteries 21B are in the first state of charge SC1), for example, the first-state resistance change rate RMX indicative of the degree of degradation is obtained, using a plurality of charging current values C1, C2, C3, and the first resumption voltage V1X, second resumption voltage V2X and the third resumption voltage V3X corresponding to the respective charging current values C1, C2, C3. The first-state resistance change rate RMX represents the degree of degradation with higher accuracy, as compared with the battery resistance change rate obtained by using a certain external charging current value ECX (e.g., the first charging current value C1), a corresponding first resumption voltage V1X, and an open-circuit voltage of the batteries 21B in the first state of charge SC1. When the current state of charge SC is the second state of charge SC2, too, the second-state resistance change rate RMY is obtained by using a plurality of charging current values C1, C2, C3, and the first resumption voltage V1Y, second resumption voltage V2Y and the third resumption voltage V3Y corresponding to the respective charging current values C1, C2, C3. The second-state resistance change rate RMY represents the degree of degradation with higher accuracy, as compared with the battery resistance change rate obtained by using a certain external charging current value ECX (e.g., the first charging current value C1), a corresponding first resumption voltage V1Y, and an open-circuit voltage of the batteries 21B in the second state of charge SC2. When the current state of charge SC is the third state of charge SC3, too, the third-state resistance change rate RMZ is obtained by using a plurality of charging current values C1, C2, C3, and the first resumption voltage V1Z, second resumption voltage V2Z and the third resumption voltage V3Z corresponding to the respective charging current values C1, C2, C3. The third-state resistance change rate RMZ represents the degree of degradation with higher accuracy, as compared with the battery resistance change rate obtained by using a certain external charging current value ECX (e.g., the first charging current value C1), first resumption voltage V1Z, and an open-circuit voltage of the batteries 21B in the third state of charge SC3.

The battery resistance change rate RM, which is an average value of the above-mentioned first-state resistance change rate RMX, second-state resistance change rate RMY and the third-state resistance change rate RMZ, also represents the degree of degradation of the batteries 21B with high accuracy. Accordingly, degradation of the batteries 21B can be detected with high accuracy, based on the battery resistance change rate RM.

In the meantime, it has been found that the battery resistance of the batteries 21B varies depending on the state of charge SC of the batteries 21B. Accordingly, it is preferable to detect a change in the battery resistance with time when the batteries are in a specified state of charge SC, so as to detect degradation of the batteries 21B. Thus, the control device 10 of this embodiment includes a state-of-charge detecting unit that executes the above-described steps S4, S6 and S8, and a degradation detection executing unit that executes the above-described steps S5, S7, S9. With this arrangement, the magnitude of the battery resistance (e.g., the first-state resistance RAX) of the batteries 21B when the current state of charge SC is a specified state of charge (e.g., the first state of charge SC1 (SOC 50%)) can be detected. By using the detected battery resistance, a change of the battery resistance with time, e.g., the first-state resistance change rate RMX, in the specified state of charge (e.g., the first state of charge SC1) can be grasped with high accuracy, and degradation of the batteries 21B can be accurately detected based on the change rate.

As the state of charge SC of the batteries 21B varies, the battery resistance change rate indicative of the degree of degradation also tends to vary, i.e., become different values.

In view of this tendency, the control device 10 of this embodiment obtains the first-state resistance change rate RMX, second-state resistance change rate RMY and the third-state resistance change rate RMZ each indicating the degree of degradation of the batteries 21B, when the batteries 21B are in three specified states of charge (first state of charge SC1, second state of charge SC2, and third state of charge SC3), respectively. Then, the battery resistance change rate RM is obtained using these resistance change rates, so that the degree of degradation of the batteries 21B can be detected with further improved accuracy.

The degree of degradation is detected by calculating the first-state resistance change rate RMX, second-state resistance change rate RMY and the third-state resistance change rate RMZ from the battery resistances RAX, RAY, RAZ of the batteries 21B, and further calculating the battery resistance change rate RM. Thus, the degree of degradation of the batteries 21B can be detected with high accuracy, by comparing the magnitudes of the battery resistances RAX, RAY, RAZ that vary with time.

The vehicle 1 of the invention, which includes the above-described control device 10, is able to detect the battery resistances RAX, RAY, RAZ of the batteries 21B, using external charging current EC of the external power supply XV having a higher stability than charging current provided by the engine 50 or the front motor 41 and rear motor 42. Accordingly, the vehicle 1 is able to accurately detect degradation represented by the battery resistance change rate RM of the batteries 21B used as a driving power source of the motors 41, 42.

Next, a vehicle 101 according to a second embodiment of the invention will be described with reference to FIGS. 1, 2, 9-14. The vehicle 101 of the second embodiment is different from that of the first embodiment in that a control device 110 of the vehicle 101 includes a charge interruption type degradation detecting unit that brings the batteries into a no-load condition over a predetermined interruption period, after external charging, and detects degradation of the batteries, based on changes of the battery voltage which occur during the interruption period.

Namely, a charge interruption type degradation detection subroutine S120 (see FIGS. 9A and 9B) is used in the second embodiment, in place of the current variation type degradation detection subroutine S20 (see FIGS. 3A and 3B) of the above-described first embodiment. The charge interruption type degradation detection subroutine S120 will be described below with reference to FIGS. 10-14. In the control device 110, numerical values of battery resistances (first-state initial resistance RBX0, second-state initial resistance RBY0, and third-state initial resistance RBZ0) obtained in the initial period of installation of the batteries on the vehicle, out of the battery resistances (first-state resistance RAX, second-state resistance RAY, third-state resistance RAZ) of the batteries 21B which will be described later, are stored in advance.

Figure 10:
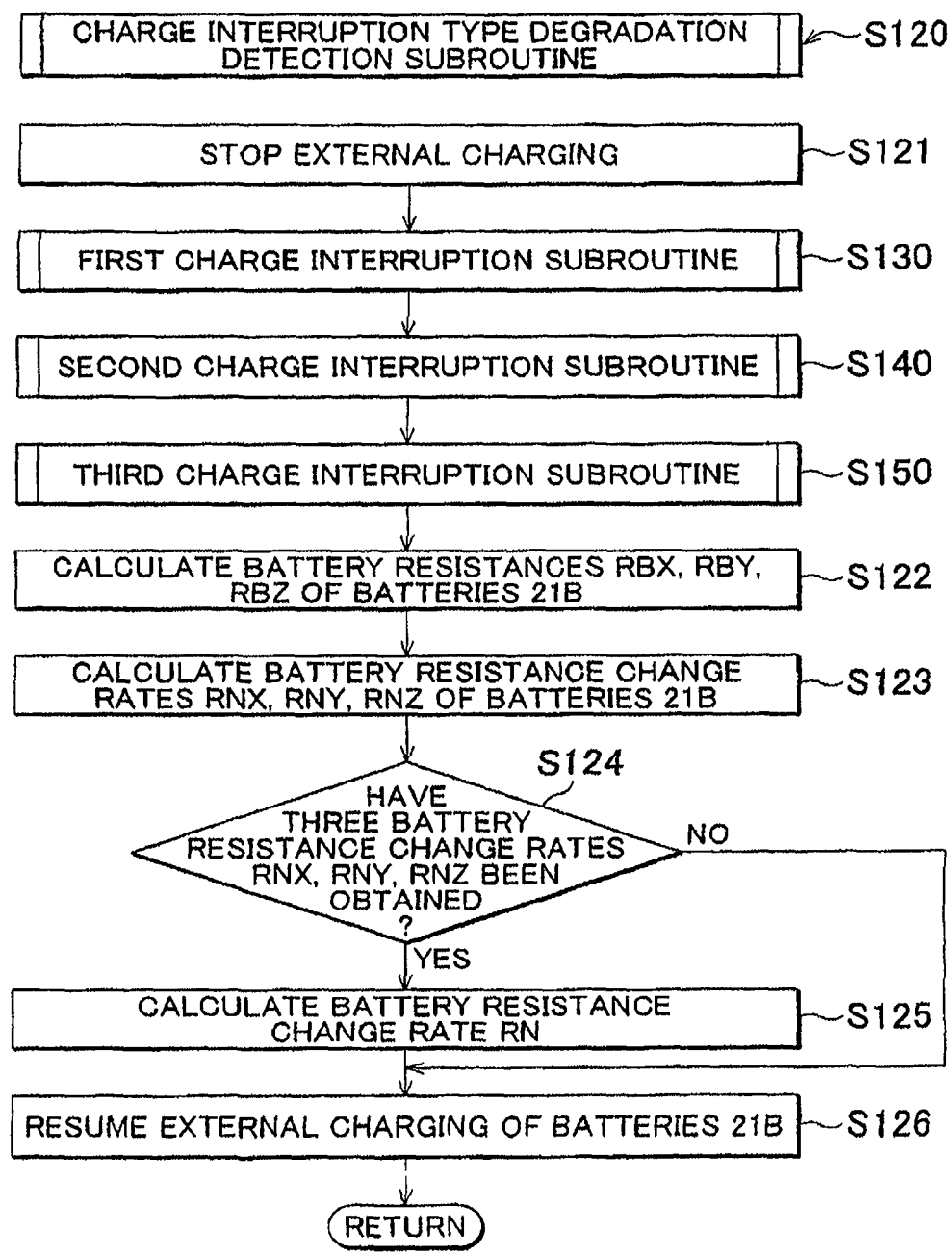
FIG. 10 is a flowchart illustrating a charge interruption type degradation detection subroutine of the second embodiment.

As shown in FIG. 10, the charge interruption type degradation detection subroutine S120 includes a first charge interruption subroutine S130, a second charge interruption subroutine S140, and a third charge interruption subroutine S150. In the first charge interruption subroutine S130, the external charging current value ECX is changed to a specified charging current value C1 at which the batteries 21B are externally charged, and the external charging is then stopped over a predetermined interruption period JT. In the second charge interruption subroutine S140, the external charging current value ECX is changed to a specified charging current value C2 at which the batteries 21B are externally charged, and the external charging is then stopped over the predetermined interruption period JT. In the third charge interruption subroutine S150, the external charging current value ECX is changed to a specified charging current value C3 at which the batteries 21B are externally charged, and the external charging is then stopped over the predetermined interruption period IT. Then, the battery resistances RBX, RBY, RBZ of the batteries 21B, and the first-state resistance change rate RNX, second-state resistance change rate RNY, third-state resistance change rate RNZ, and the battery resistance change rate RN are calculated, based on measurement values obtained in the first charge interruption subroutine S130, second charge interruption subroutine S140 and the third charge interruption subroutine S150. As in the first embodiment, the charge interruption type degradation detection subroutine S120 is performed on the batteries 21B with respect to which an affirmative decision (YES) is obtained in step S5, step S7 or step S9 of the main routine. Namely, when the current state of charge SC of the batteries 21B is the first state of charge SC1, the second state of charge SC2, or the third state of charge SC3, the charge interruption type degradation detection subroutine S120 is carried out. First, the case where the current state of charge SC of the batteries 21B is the first state of charge SC1 (where an affirmative decision (YES) is obtained in step S5) will be explained below.

Figure 11:
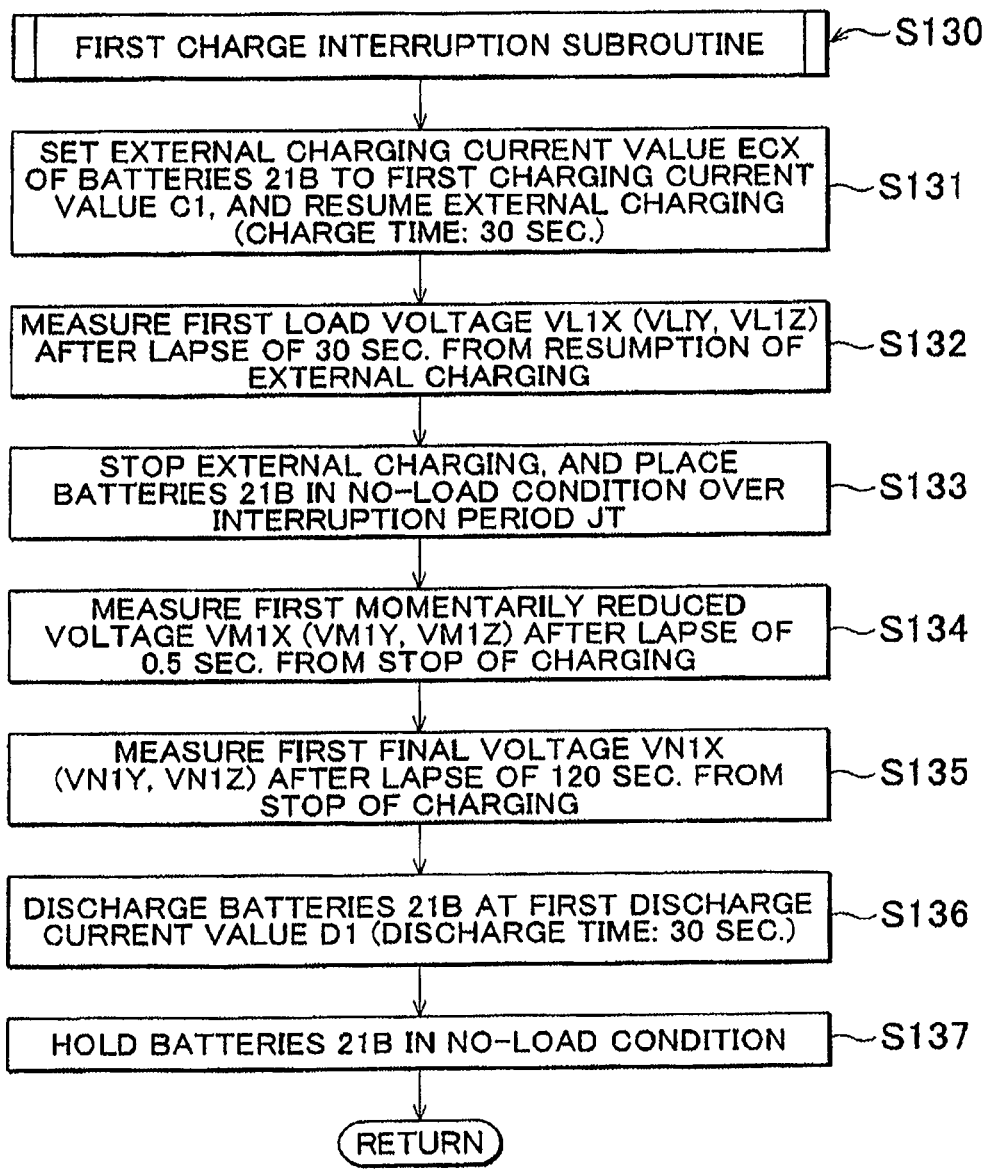
FIG. 11 is a flowchart illustrating a first charge interruption subroutine of the second embodiment.

Initially, in step S121, external charging of the batteries 21B at the basic current value C0 is stopped for five minutes, as in the first embodiment. Then, the control device 110 proceeds to the first charge interruption subroutine of step S130. In the first charge interruption subroutine S130, as shown in FIG. 11, the external charging current value ECX of the batteries 21B is set to a first charging current value C1 (0.5 A in this embodiment), and external charging is resumed for a short period of time (30 seconds) (step S131). Then, the battery monitoring device 22 measures the terminal voltage (first load voltage VL1X) of the batteries 21B, after a lapse of 30 seconds from the resumption of external charging (step S132).

Figure 14:
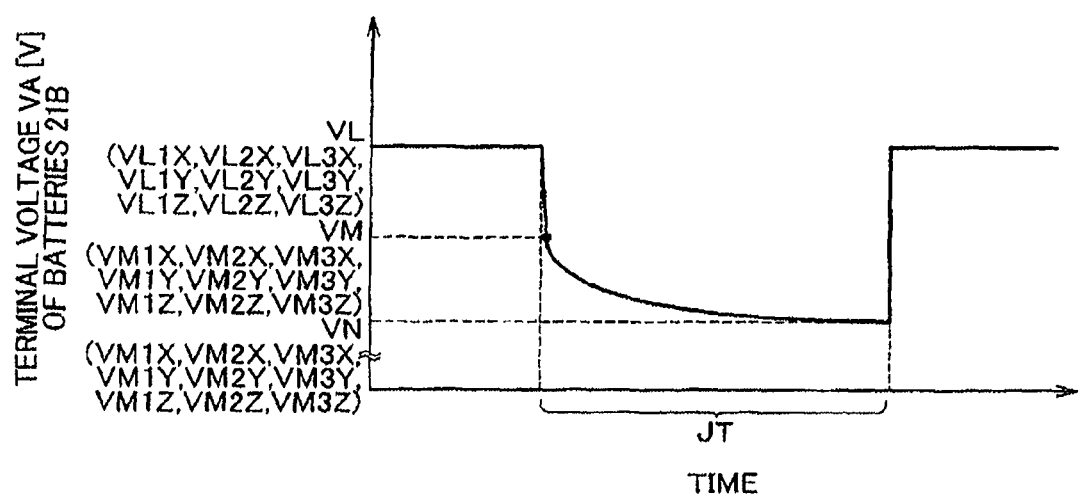
FIG. 14 is a graph indicating changes in the terminal voltage of the secondary batteries with time.

When the batteries 21B stop being charged, and are brought into a no-load condition, the terminal voltage VA is momentarily reduced from a load voltage VL to a momentarily reduced voltage VM immediately after stop of charging, and is then slowly reduced to a final voltage VN, as shown in FIG. 14. It is considered that the reduction from the load voltage VL to the momentarily reduced voltage VM does not depend on battery characteristics of the batteries 21B, but is caused by resistance to current passing through wires, such as contact resistance of the wires. On the other hand, it is considered that the reduction from the momentarily reduced voltage VM to the final voltage VN is caused by material diffusion derived from electrochemical reactions in the batteries 21B. Accordingly, it can be considered that the difference between the momentarily reduced voltage VM and the final voltage VN reflects how the electrochemical reactions occur in the batteries 21B.

Thus, in step S133, external charging is stopped after a lapse of 30 seconds from resumption of external charging, and the batteries 21B are placed in a no-load condition over a predetermined interruption period JT (120 seconds in this embodiment). During the interruption period, the battery monitoring device 22 measures the terminal voltage (first momentarily reduced voltage VM1X) of the batteries 21B in step S134, after a lapse of 0.5 second from the stop of charging. Furthermore, in step S135, the battery monitoring device 22 measures the terminal voltage (first final voltage VN1X) of the batteries 2113, after a lapse of 120 seconds from the stop of charging.

Then, in step S136, the magnitude of the external discharge current ED (external discharge current value EDX) of the batteries 21B is set to a first discharge current value D1 that is equal to the first charging current value C1 of step S131, and the batteries 21B are discharged for 30 seconds. As a result, the amount of electricity with which the batteries 21B were externally charged in the above step S131 is discharged, so that the state of charge SC of the batteries 21B after discharging becomes equal to that established immediately before step S131. After execution of step S136, the batteries 21B are held in a no-load condition for a given period of time (step S137), and the control device 110 returns to the charge interruption type degradation detection subroutine S120.

Figure 12:
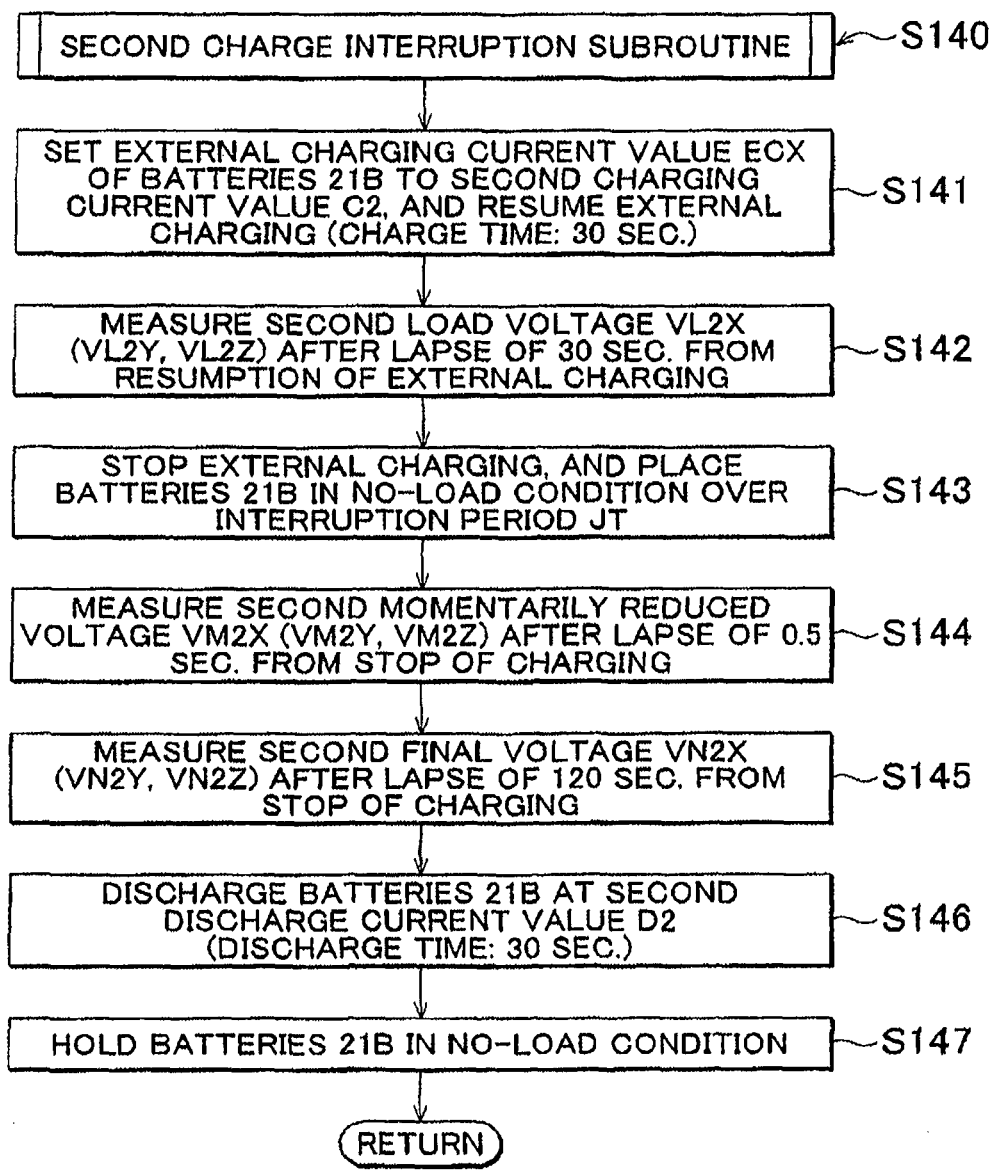
FIG. 12 is a flowchart illustrating a second charge interruption subroutine of the second embodiment.

Then, the control device 110 proceeds to the second charge interruption subroutine of step S140. In the second charge interruption subroutine S140, as shown in FIG. 12, the external charging current value ECX of the batteries 21B is set to a second charging current value C2 (1.0 A in this embodiment), and external charging is resumed (step S141). Then, the battery monitoring device 22 measures the terminal voltage (second load voltage VL2X) of the batteries 21B, after a lapse of 30 seconds from the resumption of external charging (step S142). Then, in step S143, external charging is stopped after a lapse of 30 seconds from the resumption of external charging, as in step S133, and the batteries 21B are placed in a no-load condition over the predetermined interruption period JT. During the interruption period, the battery monitoring device 22 measures the terminal voltage (second momentarily reduced voltage VM2X) of the batteries 21B in step S144, after a lapse of 0.5 second from the stop of charging, and measures the terminal voltage (second final voltage VN2X) of the batteries 21B in step S145, after a lapse of 120 seconds from the stop of charging.

Then, in step S146, the magnitude of the external discharge current ED (the external discharge current value EDX) of the batteries 21B is set to a second discharge current value D2 that is equal to the second charging current value C2 of step S141, and the batteries 21B are discharged for 30 seconds. After execution of step S146, the batteries 21B are held in a no-load condition for a given period of time (step S147), and the control device 110 returns to the charge interruption type degradation detection subroutine S120.

Figure 13:
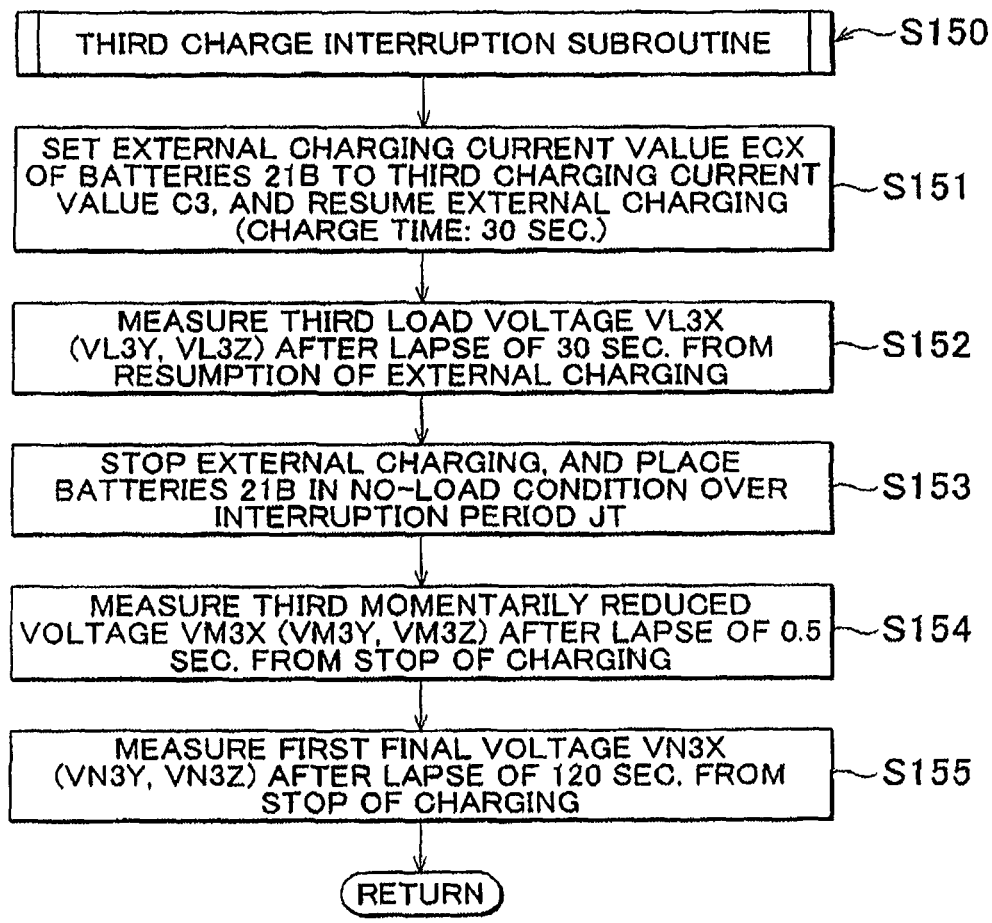
FIG. 13 is a flowchart illustrating a third charge interruption subroutine of the second embodiment.

Then, the control device 110 proceeds to the third charge interruption subroutine of step S150. In the third charge interruption subroutine S150, as shown in FIG. 13, the external charging current value ECX of the batteries 21B is set to a third charging current value C3 (2.0 A in this embodiment), and external charging is resumed (step S151). Then, the battery monitoring device 22 measures the terminal voltage (third load voltage VL3X) of the batteries 21B, after a lapse of 30 seconds from the resumption of external charging (step S152). Then, in step S153, external charging is stopped after a lapse of 30 seconds from the resumption of external charging, and the batteries 21B are placed in a no-load condition over the predetermined interruption period JT. The battery monitoring device 22 measures the terminal voltage (third momentarily reduced voltage VM3X) of the batteries 21B in step S154, after a lapse of 0.5 second from the stop of charging, and measures the terminal voltage (third final voltage VN3X) of the batteries 21B in step S155, after a lapse of 120 seconds from the stop of charging. Then, the control device 110 returns to the charge interruption type degradation detection subroutine S120.

Subsequently, in step S122, the control device 110 calculates the first-state resistance RBX of the batteries 21B for the case where the current state of charge SC is the first state of charge SC1 (SOC 50%), based on the first charging current value C1, second charging current value C2 and the third charging current value C3, and the first load voltage VL1X, second load voltage VL2X, third load voltage VL3X, first momentarily reduced voltage VM1X, second momentarily reduced voltage VM2X, third momentarily reduced voltage VM3X, first final voltage VN1X, second final voltage VN2X, and the third final voltage VN3X, which are measured by the battery monitoring device 12.

In the cases where the current state of charge SC of the batteries 21B is the second state of charge SC2 (SOC 70%), and where the current state of charge SC is the third state of charge SC3 (SOC 90%), too, the second-state resistance RBY for the second state of charge SC2 and the third-state resistance RBZ for the third state of charge SC3 are calculated in the same manner as in the above-described step S122. Namely, the second-state resistance RBY for the second state of charge SC2 is calculated, based on the charging current values C1, C2, C3, measurement results (first load voltage VL1Y, first momentarily reduced voltage VM1Y, first final voltage VN1Y) obtained in the first charge interruption subroutine S130, measurement results (second load voltage VL2Y, second momentarily reduced voltage VM2Y, second final voltage VN2Y) obtained in the second charge interruption subroutine S140, and measurement results (third load voltage VL3Y, third momentarily reduced voltage VM3Y, third final voltage VN3Y) of the third charge interruption subroutine S150, in the case where the current state of charge SC is the second state of charge SC2. Also, the third-state resistance RBZ is calculated, based on the charging current values C1, C2, C3, measurement results (first load voltage VL1Z, first momentarily reduced voltage VM1Z, first final voltage VN1Z) obtained in the first charge interruption subroutine S130, measurement results (second load voltage VL2Z, second momentarily reduced voltage VM2Z, second final voltage VN2Z) obtained in the second charge interruption subroutine S140, and measurement results (third load voltage VL3Z, third momentarily reduced voltage VM3Z, third final voltage VN3Z) obtained in the third charge interruption subroutine S150, in the case where the current state of charge SC is the third state of charge SC3.

Then, in step S123, the rate of change RNX of the first-state resistance of the batteries 21B is calculated. The first-state resistance change rate RNX is a value obtained by dividing the value of the first-state resistance RBX by the first-state initial resistance RBX0 of the batteries 21B. In the case where the current state of charge SC of the batteries 21B is the second state of charge SC2 and the case where the current state of charge SC is the third state of charge SC3, too, the second-state resistance change rate RNY and the third-state resistance change rate RNZ are calculated, respectively, in the same manner as described above.

Then, in step S124, it is determined whether three rates of change of battery resistance (i.e., the first-state resistance change rate RNX, second-state resistance change rate RNY, and the third-state resistance change rate RNZ) for the first state of charge SC1, second state of charge SC2 and the third state of charge SC3, respectively, have been obtained. If any of the first-state resistance change rate RNX, second-state resistance change rate RNY and the third-state resistance change rate RNZ has not been obtained, the control device 110 proceeds to step S126. On the other hand, if all of the first-state resistance change rate RNX, second-state resistance change rate RNY and the third-state resistance change rate RNZ are obtained, the control device 110 proceeds to step S125, and calculates the rate of change RN of battery resistance of the batteries 21B.

In step S125, the battery resistance change rate RN is calculated by averaging the first-state resistance change rate RNX, second-state resistance change rate RNY, and the third-state resistance change rate RNZ. The battery resistance change rate RN, and the first-state resistance change rate RNX, second-state resistance change rate RNY and the third-state resistance change rate RNZ provide indicators indicating the degree of degradation of the batteries 21B.

In step S126, external charging of the batteries 21B at the basic current value C0 is resumed, and the control device 110 completes the charge interruption type degradation detection subroutine S120 and returns to the above-mentioned main routine.

As is understood from the above description, the control device 110 of the vehicle 101 according to the second embodiment of the invention has the charge interruption type degradation detection subroutine S120 including the first charge interruption subroutine S130, second charge interruption subroutine S140 and the third charge interruption subroutine S150. Therefore, changes from the load voltage VL to the momentarily reduced voltage VM, and changes from the momentarily reduced voltage VM to the final voltage VN can be detected from changes in the terminal voltage VA of the batteries 21B in a no-load condition during the interruption period JT. Then, the battery resistances RBX, etc. of the batteries 21B due to electrochemical reactions within the batteries 21B are obtained, using the changes from the momentarily reduced voltage VM to the final voltage VN due to battery characteristics of the batteries 21B. Furthermore, the degree of degradation of the batteries 21B represented by the first-state resistance change rate RNX, second-state resistance change rate RNA, third-state resistance change rate RNZ, and the battery resistance change rate RN can be detected with high accuracy, based on the battery resistance RBX, etc.

While the invention has been described with reference to the first embodiment and the second embodiment, it is to be understood that the invention is not limited to these embodiments, but may be embodied with various changes or modifications as needed, without departing from the principle thereof. For example, while the power supply that supplies electric power via the household receptacle or wall outlet (AC 100V) is used as the external power supply in the first embodiment, a power supply that supplies power via an industrial receptacle for industrial use in, for example, a factory, or a charger, may also be used as the external power supply. In the first and second embodiments, the average of the first-state resistance change rate RMX, RNX, second-state resistance change rate RMY, RNY, and the third-state resistance change rate RMZ, RNZ in the respective states of charge SC1, SC2 and SC3 is obtained as the battery resistance change rate RM, RN of the batteries. However, the maximum value, or the minimum value, or the middle value of the first-state resistance change rate, second-state resistance change rate and the third-state resistance change rate in the respective states of charge may be set as the battery resistance change rate of the batteries.

The invention claimed is:

1. A battery control system for a vehicle including a vehicle body, an engine and a motor installed on the vehicle body, a secondary battery used as a driving power source of the motor, and an external charging unit that externally charges the secondary battery, using an external power supply located outside the vehicle body, said battery control system being adapted to control the external charging unit, comprising:

a degradation detecting unit that detects degradation of the secondary battery during external charging of the secondary battery by the external charging unit;

a state-of-charge detecting unit that detects a state of charge of the secondary battery; and a degradation detection executing unit that causes the degradation detecting unit to execute detection of degradation of the secondary battery, when the state of charge of the secondary battery becomes a specified levels of state of charge while the external charging unit externally charges the secondary battery, using the external power supply, wherein the degradation detection executing unit is a multiple level degradation detection execution unit that causes detection of degradation of the secondary battery, when the state of charge of the secondary battery becomes one of a plurality of specified levels of states of charge.

2. The battery control system according to claim 1, wherein the degradation detecting unit detects degradation of the secondary battery, based on a magnitude of battery resistance of the secondary battery.

3. A vehicle comprising:

a vehicle body;

an engine and a motor installed on the vehicle body;

a secondary battery used as a driving power source of the motor;

an external charging unit that externally charges the secondary battery, using an external power supply located outside the vehicle body; and the battery control system according to claim 1.

* * * * *